United States Patent
Liao et al.

(10) Patent No.: US 11,699,899 B2
(45) Date of Patent: Jul. 11, 2023

(54) ELECTRONIC DEVICE AND ELECTROSTATIC DISCHARGE PROTECTION CIRCUIT

(71) Applicant: INNOSCIENCE (ZHUHAI) TECHNOLOGY CO., LTD., Zhuhai (CN)

(72) Inventors: Hang Liao, Zhuhai (CN); Chunhua Zhou, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 415 days.

(21) Appl. No.: 16/958,159

(22) PCT Filed: Apr. 28, 2020

(86) PCT No.: PCT/CN2020/087413
§ 371 (c)(1),
(2) Date: Jun. 26, 2020

(87) PCT Pub. No.: WO2021/217400
PCT Pub. Date: Nov. 4, 2021

(65) Prior Publication Data
US 2022/0376493 A1    Nov. 24, 2022

(51) Int. Cl.
*H02H 9/04* (2006.01)
*H01L 27/02* (2006.01)

(52) U.S. Cl.
CPC ......... *H02H 9/046* (2013.01); *H01L 27/0248* (2013.01)

(58) Field of Classification Search
CPC .......................... H02H 9/046; H01L 27/0248
USPC .............................................................. 361/56
See application file for complete search history.

(56) References Cited

U.S. PATENT DOCUMENTS

| 6,946,707 B2 | 9/2005 | Voldman |
| 2005/0161743 A1 | 7/2005 | Voldman |
| 2007/0159754 A1 | 7/2007 | Huang et al. |

(Continued)

FOREIGN PATENT DOCUMENTS

| CN | 101039027 A | 9/2007 |
| CN | 104392989 A | 3/2015 |

(Continued)

OTHER PUBLICATIONS

International Search Report and Written Opinion of the corresponding PCT application No. PCT/CN2020/087413 dated Feb. 3, 2021.

(Continued)

*Primary Examiner* — Dharti H Patel
(74) *Attorney, Agent, or Firm* — McCoy Russell LLP

(57) ABSTRACT

An electronic device includes a first group III nitride transistor and an electrostatic discharge (ESD) protection circuit. The ESD protection circuit includes a diode and a second transistor. The diode has an anode electrically connected to a gate of the first group III nitride transistor. The second transistor has a drain electrically connected to the gate of the first group III nitride transistor, a gate electrically connected to a cathode of the diode and a source electrically connected to a source of the first group III nitride transistor.

18 Claims, 3 Drawing Sheets

(56) References Cited

U.S. PATENT DOCUMENTS

| | | | |
|---|---|---|---|
| 2008/0062595 A1* | 3/2008 | Ping | H02H 9/046 361/56 |
| 2008/0198517 A1 | 8/2008 | Son | |
| 2018/0026029 A1* | 1/2018 | Lin | H01L 28/20 361/56 |

FOREIGN PATENT DOCUMENTS

| | | |
|---|---|---|
| CN | 110098184 A | 8/2019 |
| CN | 110137172 A | 8/2019 |

OTHER PUBLICATIONS

Office Action of corresponding China patent application No. 202080002674.9 dated Aug. 1, 2022.
State Intellectual Property Office of the People's Republic of China, Office Action and Search Report Issued in Application No. 202080002674.9, dated Feb. 22, 2023, 25 pages. (Submitted with Partial Translation).

* cited by examiner

ELECTRONIC DEVICE AND ELECTROSTATIC DISCHARGE PROTECTION CIRCUIT

BACKGROUND

1. Field of the Disclosure

The disclosure relates to an electronic device having an electrostatic discharge (ESD) protection circuit, and particularly to a group III-V electronic device having an ESD protection circuit.

2. Description of the Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies) due to their characteristics.

The semiconductor components may include a heterojunction bipolar transistor (HBT), a heterojunction field effect transistor (HFET), a high-electron-mobility transistor (HEMT), a modulation-doped FET (MODFET), or the like.

SUMMARY

In some embodiments, an electronic device includes a first group III nitride transistor and an electrostatic discharge (ESD) protection circuit. The ESD protection circuit includes a diode and a second transistor. The diode has an anode electrically connected to a gate of the first group III nitride transistor. The second transistor has a drain electrically connected to the gate of the first group III nitride transistor, a gate electrically connected to a cathode of the diode and a source electrically connected to a source of the first group III nitride transistor.

In some embodiments, an electronic device includes a first group III nitride transistor and an electrostatic discharge (ESD) protection circuit. The ESD protection circuit is electrically connected between a gate of the first group III nitride transistor and a source of the first group III nitride transistor. The ESD protection circuit has N diodes electrically connected in series, wherein N is an integer equal to or greater than 2. Threshold voltages of the diodes have a variation less than 0.3V.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
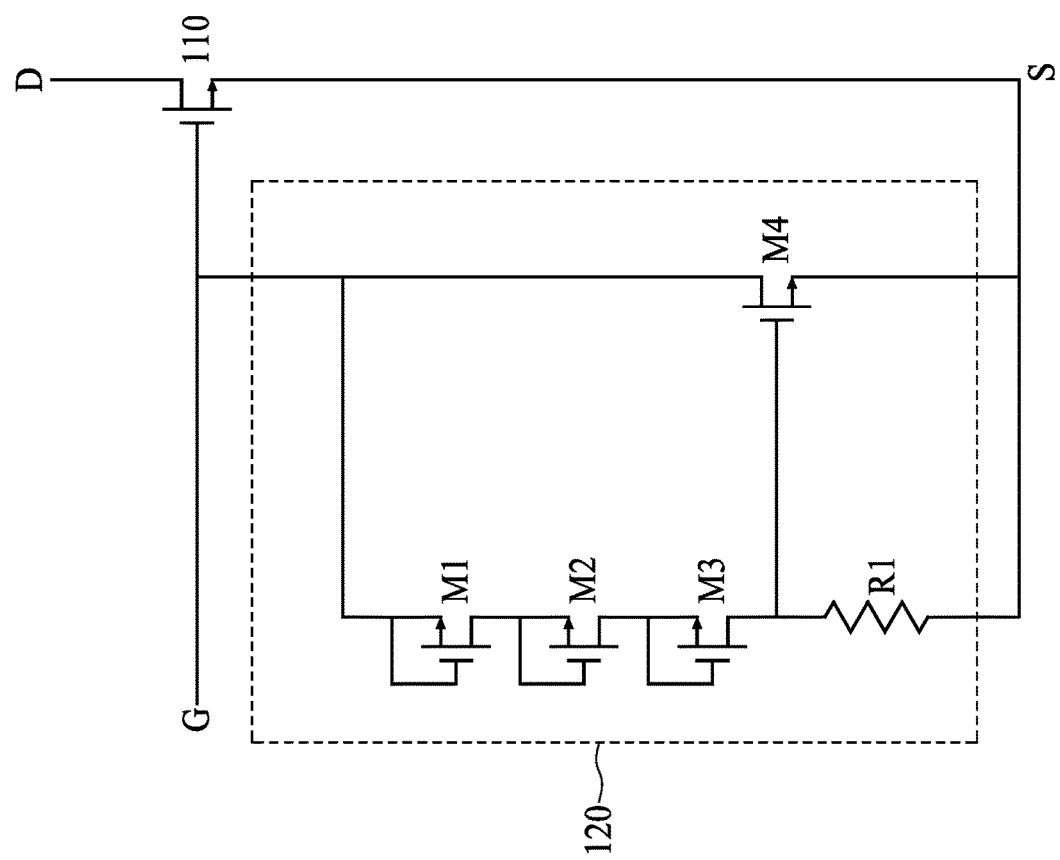
FIG. 1 illustrates a schematic diagram of an electronic device, in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Direct bandgap materials, such as group III-V compounds, may include, but are not limited to, for example, gallium arsenide (GaAs), indium phosphide (InP), gallium nitride (GaN), indium gallium arsenide (InGaAs), aluminum gallium arsenide (InAlAs), and others.

FIG. 1 illustrates a schematic diagram of an electronic device 100, in accordance with some embodiments of the present disclosure. The electronic device 100 can include a transistor 110 and an electrostatic discharge (ESD) protection circuit 120.

In some embodiments, the transistor 110 may be formed of or include a direct bandgap material, such as an III-V compound, which includes but is not limited to, for example, GaAs, InP, GaN, InGaAs and AlGaAs. In some embodiments, the transistor 110 is a GaN-based transistor. In some embodiments, the transistor 110 can include a high-electron-mobility transistor (HEMT). In some embodiments, the transistor 110 may be a power device (e.g., a power transistor) or a part of a power device.

The transistor 110 may have a gate, a drain and a source. In some embodiments, the transistor 110 may be or include a "normally-off" type of transistor. For example, in operation, if a voltage (i.e., $V_{gs}$) applied between the gate and the source of the transistor 110 is equal to or greater than a threshold voltage ($V_{th}$) of the transistor 110, the transistor 110 can be turned on to contact a current (e.g., from the drain to the source). If the voltage (i.e., $V_{gs}$) applied between the gate and the source of the transistor 110 is less than the threshold voltage ($V_{th}$) of the transistor 110, the transistor 110 would be turned off. In other embodiments, the transistor T1 may be or include a "normally-on" type of transistor depending on different design specifications.

In some embodiments, the transistor 110 includes a GaN-based HEMT, which has a relatively lower gate breakdown voltage, resulting in its gate terminal being susceptible to damage due to voltage overshoot spikes that exceed the gate breakdown voltage. Accordingly, the ESD protection circuit 120 can be connected between the gate (G) of the transistor 110 and the source (S) of the transistor 110 to protect the transistor 110 from overshoot voltage spikes during device switching or an ESD surge event. In other embodiments, the ESD protection circuit 120 may be connected between the gate of the transistor 110 and the drain (D) of the transistor 110. In other embodiments, the ESD protection circuit 120 may be connected between the drain of the transistor 110 and the source of the transistor 110.

In some embodiments, the ESD protection circuit 120 and the transistor 110 are integrated within an integrated circuit (IC) chip. Alternatively, the ESD protection circuit 120 and the transistor 110 are discretely disposed on a circuit board (e.g., a printed circuit board (PCB) or a mother board) and electrically connected to each other at the packaging level and/or the circuit board level.

The ESD protection circuit 120 includes transistors M1, M2, M3, M4 and a resistor R1. In some embodiments, the transistors M1, M2, M3, M4 can include GaN-based transistors. In some embodiments, the transistors M1, M2, M3, M4 can include HEMTs.

Each of the transistors M1, M2, M3, M4 has a gate, a drain and a source. The gate and the source of each of the transistors M1, M2, M3 are connected to each other. For example, the transistors M1, M2, M3 are diode-connected transistors, which may act as diodes. The transistors M1, M2, M3 are connected in series. For example, the gate and the source of the transistor M2 are connected to the drain of the transistor M1, the gate and the source of the transistor M3 are connected to the drain of the transistor M2. The source and the gate of the transistor M1 are connected to the gate of the transistor 110 and the drain of the transistor M4. The drain of the transistor M3 is connected to the gate of the transistor M4 and the resistor R1. The drain of the transistor M4 is connected to the gate of the transistor 110. The source of the transistor M4 is connected to the source of the transistor 110. The resistor R1 is connected between the gate of the transistor M4 and the source of the transistor M4.

In some embodiments, the transistors M1, M2, M3, M4 may include the same threshold voltage (Vth). Alternatively, the transistors M1, M2, M3, M4 may include different threshold voltages (e.g., Vth1, Vth2, Vth3, Vth4) depending on different design specifications. In some embodiments, the transistors M1, M2, M3 may include the same aspect ratio (e.g., a ratio of a width to a length). Alternatively, the transistors M1, M2, M3 may include different aspect ratios depending on different design specifications. For example, the transistors M1, M2, M3 may include different widths. In some embodiments, an aspect ratio of the transistor M4 is greater than the aspect ratio of each of the transistors M1, M2, M3. For example, the transistor M4 and the transistors M1, M2, M3 may include the same length, but the transistor M4 has a larger width, which allows the transistor M4 to carry or discharge a larger current than each of the transistors M1, M2, M3. In some embodiments, there may be any number of diode-connected transistors connected in series, although FIG. 1 illustrates three diode-connected transistors connected in series. For example, there may be N diode-connected transistors connected in series, where N is an integer equal to or greater than 1.

The ESD protection circuit 120 can be configured to protect the transistor 110 from ESD events. In operation, in the case that a voltage (Vg) applied to the gate of the transistor 110 is less than a predetermined value, the ESD protection circuit 120 would not be triggered (or is disable). The current is drained or flowed through the transistor 110. In some embodiments, the predetermined value is equal to a sum of the threshold voltages of the transistors M1, M2, M3, M4 (e.g., 4Vth or Vth1+Vth2+Vth3+Vth4). Hence, the ESD protection circuit 110 would not affect the normal work or the performance of the transistor 110 (which is in a normal work mode). In some embodiments, the resistor R1 is configured to ensure that the transistor M4 is turned off when the transistor 110 is in the normal work mode.

In the case that the voltage (Vg) applied to the gate of the transistor 110 is equal to or greater than the predetermined value (e.g., Vg≥4Vth or Vg≥Vth1+Vth2+Vth3+Vth4), the ESD protection circuit 120 would be triggered (or enabled) to drain or discharge the accumulated charge at the gate of the transistor. For example, the transistors M1, M2, M3 are turned on, and then a voltage (e.g., Vg−3Vth or Vg−Vth1−Vth2−Vth3) is applied to the gate of the transistor M4 to turn on the transistor M4. The accumulated charge is discharged or drained through the transistors M1, M2, M3 and the transistor M4 to prevent the transistor 110 from being damaged by the accumulated charge or the voltage applied to the gate of the transistor 110.

In accordance with the embodiments as shown in FIG. 1, whether the voltage applied to the gate of the transistor 110 can trigger the ESD protection circuit 120 or not may be determined by the threshold voltage of each of the transistors M1, M2, M3, M4. In other words, the threshold voltage of each of the transistors M1, M2, M3, M4 is one of the critical parameters to determine the voltage to trigger the ESD protection circuit 120. However, due to the process limitation (e.g., the non-uniformity of epitaxy operation), the threshold voltages of the transistors at different locations of a wafer may vary. For example, the transistors of a single wafer may have various threshold voltages depending on their locations. In some embodiments, the threshold voltages of the transistors of a single wafer may have a variation in a range from about 1V to about 1.2V. For example, a difference between the maximum threshold voltage of a transistor in a wafer and the minimum threshold voltage of a transistor in the wafer is in a range from about 1V to about 1.2V. The non-uniform threshold voltages of the transistors M1, M2, M3, M4 of the ESD protection circuit 120 would adversely affect the function and performance of the ESD protection circuit 120. For example, if a sum of the threshold voltages of the transistors M1, M2, M3, M4 is greater than the predetermined value (e.g., the predetermined voltage to trigger the ESD protection circuit 120), the risk of damaging the transistor 110 increases. If a sum of the threshold voltages of the transistors M1, M2, M3, M4 is lower than the predetermined value (e.g., the predetermined voltage to trigger the ESD protection circuit 120), the ESD protection circuit 120 may be turned on during the transistor 110 is operating in the normal work mode, which would increase the gate leakage.

Figure 2:
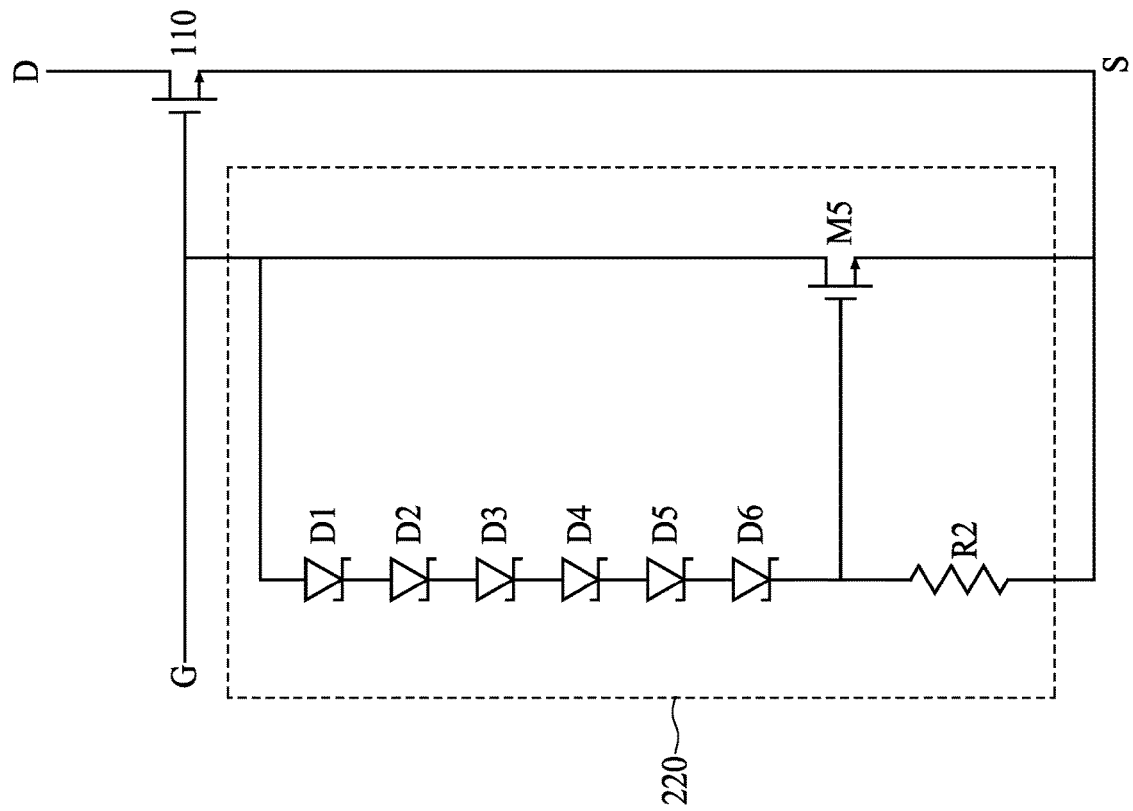
FIG. 2 illustrates a schematic diagram of an electronic device, in accordance with some embodiments of the present disclosure.

FIG. 2 illustrates a schematic diagram of an electronic device 200, in accordance with some embodiments of the present disclosure. The electronic device 200 can include the transistor 110 and an ESD protection circuit 220. The ESD protection circuit 220 is similar to the ESD protection circuit 120 as shown in FIG. 1, and some of the differences therebetween are described below.

The ESD protection circuit 220 is connected between the gate (G) of the transistor 110 and the source (S) of the transistor 110. In other embodiments, the ESD protection circuit 220 may be connected between the gate of the transistor 110 and the drain (D) of the transistor 110. In other embodiments, the ESD protection circuit 220 may be connected between the drain of the transistor 110 and the source of the transistor 110. In some embodiments, the ESD protection circuit 220 and the transistor 110 are integrated within an IC chip. For example, the ESD protection circuit 220 is integrated and fabricated together with the GaN-based transistor 110, which may reduce parasitic inductance and parasitic capacitance.

The ESD protection circuit 220 can include diodes D1, D2, D3, D4, D5, D6, a transistor M5 and a resistor R2. In some embodiments, the transistor M5 is a GaN-based transistor. In some embodiments, the transistor M5 is a HEMT.

In some embodiments, the diodes D1, D2, D3, D4, D5, D6 can include Schottky barrier diodes (SBDs). In some embodiments, the D1, D2, D3, D4, D5, D6 can include GaN-based SBDs. In some embodiments, the diodes D1, D2, D3, D4, D5, D6 have the same size. Alternatively, the diodes D1, D2, D3, D4, D5, D6 may have difference sizes depending on different design specifications.

As shown in FIG. 2, the diodes D1, D2, D3, D4, D5, D6 are connected in series. For example, a cathode of the diode D1 is connected to an anode of the diode D2, a cathode of the diode D2 is connected to an anode of the diode D3, a cathode of the diode D3 is connected to an anode of the diode D4, a cathode of the diode D4 is connected to an anode of the diode D5, and a cathode of the diode D5 is connected to an anode of the diode D6. In some embodiments, there may be any number of diodes connected in series, although FIG. 1 illustrates six diodes connected in series. For example, there may be N diodes connected in series, where N is an integer equal to or greater than 2.

The anode of the diode D1 is connected to the drain of the transistor M5 and the gate of the transistor 110. The cathode of the diode D6 is connected to the gate of the transistor M5 and the resistor R2. The drain of the transistor M5 is connected to the gate of the transistor 110. The source of the transistor M5 is connected to the source of the transistor 110. The resistor R2 is connected between the gate of the transistor M5 and the source of the transistor M5.

In some embodiments, the diodes D1, D2, D3, D4, D5, D6 may include the same threshold voltage (Vdth). Alternatively, the diodes D1, D2, D3, D4, D5, D6 may include different threshold voltages (e.g., Vdth1, Vdth2, Vdth3, Vdth4, Vdth5, Vdth6) depending on different design specifications.

The ESD protection circuit 220 is configured to protect the transistor 110 from ESD events. In operation, in the case that a voltage (Vg) applied to the gate of the transistor 110 is less than a predetermined value, the ESD protection circuit 220 would not be triggered (or is disable). The current is drained or flowed through the transistor 110. In some embodiments, the predetermined value is equal to a sum of the threshold voltages of the diodes D1, D2, D3, D4, D5, D6 and the threshold voltage of the transistor M5 (e.g., 6Vdth+Vth5 or Vdth1+Vdth2+Vdth3+Vdth4+Vdth5+Vdth6+Vth5). Hence, the ESD protection circuit 220 would not affect the normal work or the performance of the transistor 110 (which is in a normal work mode). In some embodiments, the resistor R2 is configured to ensure that the transistor M5 is turned off when the transistor 110 is in the normal work mode.

In the case that the voltage (Vg) applied to the gate of the transistor 110 is equal to or greater than the predetermined value (e.g., Vg≥6Vdth+Vth5 or Vg≥Vdth1+Vdth2+Vdth3+Vdth4+Vdth5+Vdth6+Vth5), the ESD protection circuit 220 would be triggered (or enabled) to drain or discharge the accumulated charge at the gate of the transistor 110. For example, the diodes D1, D2, D3, D4, D5, D6 are turned on, and then a voltage (e.g., Vg−6Vdth or Vg−Vdth1−Vdth2−Vdth3−Vdth4−Vdth5−Vdth6) is applied to the gate of the transistor M5 to turn on the transistor M5. The accumulated charge is discharged or drained through the diodes D1, D2, D3, D4, D5, D6 and the transistor M5 to prevent the transistor 110 from being damaged due to the accumulated charge or the voltage applied to the gate of the transistor 110. By using the ESD protection circuit 220, the voltage at the gate of the transistor 110 may be clamped during an ESD surge event, protecting the gate of the transistor 110 from being damaged. In some embodiments, the current flowing through the transistor M5 is larger than the current flowing through the diodes D1, D2, D3, D4, D5, D6. For example, the transistor M5 is configured to carry or discharge a larger current than each of the diodes D1, D2, D3, D4, D5, D6.

In some embodiments, the uniformity of diodes in epitaxy operation is better than that of transistors in epitaxy operation. Hence, compared to transistors, diodes of a single wafer have a better uniformity in threshold voltages. In other words, the variation of the threshold voltages of the diodes of a single wafer is less than the variation of the threshold voltages of the transistors of a single wafer. In some embodiments, the threshold voltages of the diodes of a single wafer may have a variation less than 0.3V. For example, the threshold voltages of the diodes of a single wafer may have a variation in a range from about 0.1V to about 0.3V. For example, a difference between the maximum threshold voltage of a diode in a wafer and the minimum threshold voltage of a diode in the wafer is less than 0.3V. Hence, the ESD protection circuit 220 has a more precise trigger voltage compared with the ESD protection circuit 120, which can reduce the risk of damaging the transistor 110 and/or the gate leakage of the transistor 110. The performance of the transistor 110 can be improved.

Figure 3:
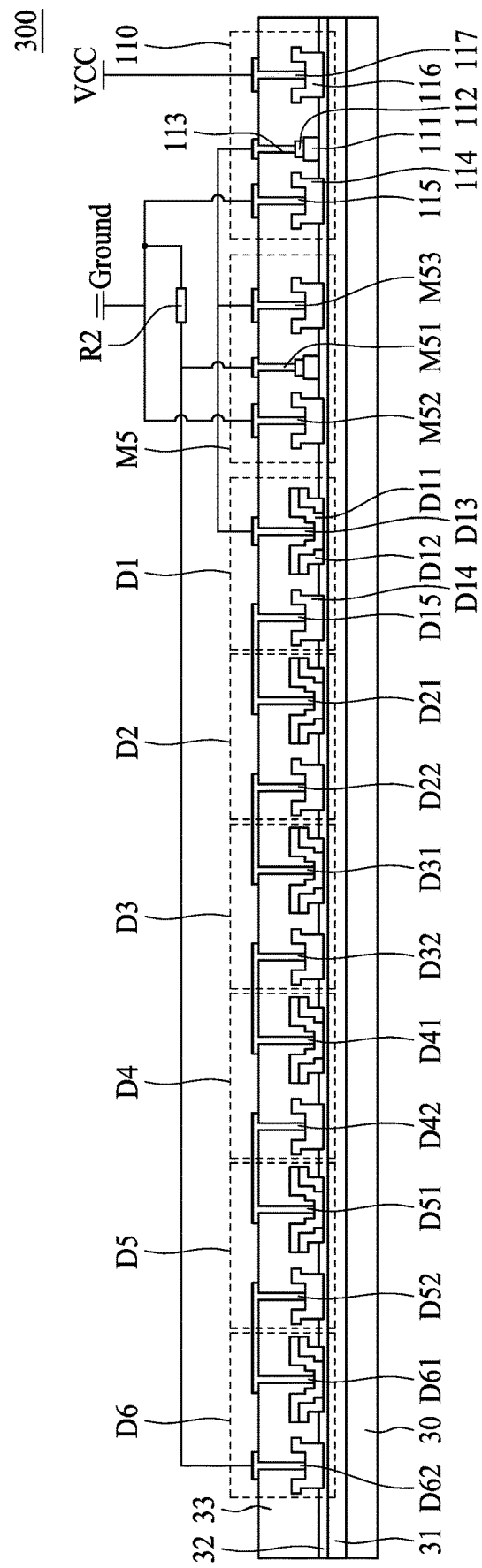
FIG. 3 illustrates a cross-sectional view of a semiconductor structure, in accordance with some embodiments of the present disclosure.

FIG. 3 illustrates a cross-sectional view of a semiconductor structure 300, in accordance with some embodiments of the present disclosure. In some embodiments, the electronic device 200 as described and illustrated with reference to FIG. 2 can have a similar or same the cross-sectional view of the semiconductor structure 300 as shown in FIG. 3. For example, the semiconductor structure 300 as shown in FIG. 3 includes transistors 110, M5 and diodes D1, D2, D3, D4, D5, D6 as shown in FIG. 2, and the transistors 110, M5 and the diodes D1, D2, D3, D4, D5, D6 are monolithically integrated. The semiconductor structure 300 includes a substrate 30, semiconductor layers 31 and 32, transistors 110, M5, diodes D1, D2, D3, D4, D5, D6 and a passivation layer 33.

The substrate 30 may include, for example, but is not limited to, silicon (Si), doped Si, silicon carbide (SiC) or other suitable material(s). In some embodiments, the substrate 30 may include a p-type semiconductor material. The substrate 30 may include a p-type semiconductor material having a doping concentration of about $10^{17}$ atoms/cm$^3$ to about $10^{21}$ atoms/cm$^3$. The substrate 30 may include a p-type semiconductor material having a doping concentration of about $10^{19}$ atoms/cm$^3$ to about $10^{21}$ atoms/cm$^3$. The substrate 30 may include a p-type semiconductor material having a doping concentration of about $10^{20}$ atoms/cm$^3$ to about $10^{21}$ atoms/cm$^3$. In some embodiments, the substrate 30 may include a p-type doped silicon layer. In some embodiments, the substrate 30 may include a silicon layer doped with arsenic (As). In some embodiments, the substrate 30 may include a silicon layer doped with phosphorus (P). In some embodiments, the substrate 30 may include an n-type semiconductor material. The substrate 30 may include an n-type semiconductor material having a doping concentration of about $10^{17}$ atoms/cm$^3$ to about $10^{21}$ atoms/cm$^3$. The substrate 30 may include an n-type semiconductor material having a doping concentration of about $10^{19}$ atoms/cm$^3$ to about $10^{21}$ atoms/cm$^3$. The substrate 30 may include an n-type semiconductor material having a doping concentration of about $10^{20}$ atoms/cm$^3$ to about $10^{21}$ atoms/cm$^3$. In some embodiments, the substrate 30 may include an n-type doped silicon layer. In some embodiments, the substrate 30 may include a silicon layer doped with boron (B). In some embodiments, the substrate 30 may include a silicon layer doped with gallium (Ga).

In some embodiments, the semiconductor structure 300 may further include a buffer layer (not shown in the figure). The buffer layer may be disposed between the substrate 30 and the semiconductor layer 12. In some embodiments, the buffer layer may include nitrides. In some embodiments, the buffer layer may include, for example, but is not limited to, aluminum nitride (AlN). In some embodiments, the buffer layer may include, for example, but is not limited to, aluminum gallium nitride (AlGaN). In some embodiments, the buffer layer may include a multilayer structure. In some other embodiments, the buffer layer can include a single layer structure.

The semiconductor layer 31 may be disposed on the substrate 30. The semiconductor layer 31 may include a III-V material or compound. The semiconductor layer 31 may include, for example, but is not limited to, a group III nitride. The semiconductor layer 31 may include, for example, but is not limited to, gallium nitride (GaN). The semiconductor layer 31 may include, for example, but is not limited to, aluminum nitride (AlN). The semiconductor layer 31 may include, for example, but is not limited to, indium nitride (InN). The semiconductor layer 31 may include, for example, but is not limited to, a compound of $In_xAl_yGa_{(1-x-y)}N$, where $x+y \le 1$. The semiconductor layer 31 may include, for example, but is not limited to, a compound of $Al_yGa_{(1-y)}N$, where $y \le 1$.

The semiconductor layer 32 may be disposed on the semiconductor layer 31. The semiconductor layer 32 may include, for example, but not limited to, a group III nitride. The semiconductor layer 32 may include, for example, but not limited to, a compound of $Al_yGa_{(1-y)}N$, where $y \le 1$. The semiconductor layer 32 may include, for example, but is not limited to, GaN. The semiconductor layer 32 may include, for example, but is not limited to, AlN. The semiconductor layer 32 may include, for example, but is not limited to, InN. The semiconductor layer 32 may include, for example, but is not limited to, a compound of $In_xAl_yGa_{(1-x-y)}N$, where $x+y \le 1$.

A heterogeneous interface can be formed between the semiconductor layer 31 and the semiconductor layer 32. The semiconductor layer 32 may have a relatively greater band gap than the semiconductor layer 31. For example, the semiconductor layer 32 may include AlGaN, the AlGaN may have a band gap of about 4 eV, the semiconductor layer 31 may include GaN, and GaN may have a band gap of about 3.4 eV.

In some embodiments, the semiconductor layer 31 may function as or include an electron channel region or channel layer. The channel layer may include a two-dimensional electron gas (2DEG) region, which is generally available in a heterostructure. In the 2DEG region, the electron gas can move freely in a two-dimensional direction (or lateral direction), but is limited in the movement in another dimension (e.g. vertical direction). In some embodiments, the channel region can be formed within the semiconductor layer 31. In some embodiments, the channel region can be formed adjacent to an interface between the semiconductor layer 31 and the semiconductor layer 32.

In some embodiments, the semiconductor layer 32 may function as a barrier layer. For example, the semiconductor layer 32 may function as a barrier layer provided on the semiconductor layer 31.

The transistor 110 is disposed on the semiconductor layer 32. In some embodiments, the transistor 110 includes a doped semiconductor layer 111, and conductive structures 112, 113, 114, 115, 116, 117.

The doped semiconductor layer 111 may be disposed on the semiconductor layer 32. The doped semiconductor layer 111 may include a doped III-V material. In some embodiments, the doped semiconductor layer 111 may include a p-type III-V group material. The doped semiconductor layer 111 may include, for example, but not limited to, a p-type group III nitride. The doped semiconductor layer 111 may include, for example, but is not limited to, p-type GaN. The doped semiconductor layer 111 may include, for example, but is not limited to, a p-type AlN. The doped semiconductor layer 111 may include, for example, but is not limited to, a p-type InN. The doped semiconductor layer 111 may include, for example, but is not limited to, p-type AlGaN. The doped semiconductor layer 111 may include, for example, but is not limited to, p-type InGaN. The doped semiconductor layer 111 may include, for example, but is not limited to, a p-type InAlN. When the doped semiconductor layer 111 includes a p-type III-V group material, the doped material of the doped semiconductor layer 111 may include, for example, but is not limited to, at least one of Mg, Zn, and Ca.

The doped semiconductor layer 111 may also include other p-type semiconductor materials. The doped semiconductor layer 111 may include, for example, but is not limited to, p-type CuO. The doped semiconductor layer 111 may include, for example, but is not limited to, p-type $NiO_x$. When the doped semiconductor layer 111 includes p-type CuO, the doping material of the doped semiconductor layer 111 may include, for example, but is not limited to, at least one of Mg, Zn, and Ca. When the doped semiconductor layer 111 includes p-type $NiO_x$ the doped material of the doped semiconductor layer 111 may include, for example, but is not limited to, at least one of Mg, Zn, and Ca.

The doped semiconductor layer 111 may include a p-type semiconductor material having a doping concentration of about $10^{17}$ atoms/cm$^3$ to about $10^{21}$ atoms/cm$^3$. The doped semiconductor layer 111 may include a p-type semiconductor material having a doping concentration of about $10^{19}$ atoms/cm$^3$ to about $10^{21}$ atoms/cm$^3$. The doped semiconductor layer 111 may include a p-type semiconductor material having a doping concentration of about $10^{20}$ atoms/cm$^3$ to about $10^{21}$ atoms/cm$^3$.

The conductive structure 112 may be disposed on the doped semiconductor layer 111. The doped semiconductor layer 111 is disposed between the conductive structure 112 and the semiconductor layer 32. In some embodiments, the conductive structure 112 may include metal. The conductive structure 112 may include, for example, but is not limited to, gold (Au), platinum (Pt), titanium (Ti), palladium (Pd), nickel (Ni), and tungsten (W). In some embodiments, the conductive structure 112 may include alloy. The conductive structure 112 may include, for example, but is not limited to, titanium nitride (TiN).

The conductive structure 113 may be disposed on the conductive structure 112. The conductive structure 113 may serve as a through via. The conductive structure 113 may serve as a through via electrically connecting the conductive structure 112 to the outside. The conductive structure 113 may include metal. The conductive structure 113 may include a metal compound. The conductive structure 113 may include, for example, but not limited to, copper (Cu), tungsten carbide (WC), titanium (Ti), titanium nitride (TiN), or aluminum copper (Al—Cu).

In some embodiments, the conductive structure 113 (or the conductive structure 112) may function as a gate (or a gate terminal) of the transistor 110. For example, the conductive structure 113 may be configured to control the channel region (or the 2DEG) in the semiconductor layer 31. For example, the conductive structure 113 may be applied with a voltage to control the channel region in the semiconductor layer 31. For example, the conductive structure 113 may be applied with a voltage to control the channel region in the semiconductor layer 31 and below the conductive structure 113. For example, the conductive structure 113 may be applied with a voltage to control the conduction or control the conduction between the conductive structure 114 and the conductive structure 116.

The conductive structure 114 is disposed on the semiconductor layer 32. The conductive structure 114 may include a metal. In some embodiments, the conductive structure 114 may include, for example, but not limited to, aluminum (Al), titanium (Ti), palladium (Pd), nickel (Ni), and tungsten (W). In some embodiments, the conductive structure 114 may include a metal alloy. The conductive structure 114 may include, for example, but not limited to, titanium nitride (TiN). In some embodiments, as shown in FIG. 3, the conductive structure 114 may extend within a portion of the semiconductor layer 32. For example, the semiconductor layer 32 may cover a least a portion of a lateral surface (or sidewall) of the conductive structure 114. In other embodiments, the conductive structure 114 may not extend within the semiconductor layer 32. For example, a bottom surface of the conductive structure 114 is in contact with a top surface of the semiconductor layer 32.

The conductive structure 115 is disposed on the conductive structure 114. The conductive structure 115 may serve as a through via. The conductive structure 115 may serve as a through via electrically connecting the conductive structure 114 to the outside. The conductive structure 115 may include metal. The conductive structure 115 may include a metal compound. The conductive structure 115 may include, for example, but not limited to, copper (Cu), tungsten carbide (WC), titanium (Ti), titanium nitride (TiN), or aluminum copper (Al—Cu).

The conductive structure 116 is disposed on the semiconductor layer 32. The conductive structure 116 may include a metal. In some embodiments, the conductive structure 116 may include, for example, but not limited to, aluminum (Al), titanium (Ti), palladium (Pd), nickel (Ni), and tungsten (W). In some embodiments, the conductive structure 116 may include a metal alloy. The conductive structure 116 may include, for example, but not limited to, titanium nitride (TiN). In some embodiments, as shown in FIG. 3, the conductive structure 116 may extend within a portion of the semiconductor layer 32. For example, the semiconductor layer 32 may cover a least a portion of a lateral surface (or sidewall) of the conductive structure 116. In other embodiments, the conductive structure 116 may not extend within the semiconductor layer 32. For example, a bottom surface of the conductive structure 116 is in contact with a top surface of the semiconductor layer 32.

The conductive structure 117 is disposed on the conductive structure 116. The conductive structure 117 may serve as a through via. The conductive structure 117 may serve as a through via electrically connecting the conductive structure 116 to the outside. The conductive structure 117 may include metal. The conductive structure 117 may include a metal compound. The conductive structure 117 may include, for example, but not limited to, copper (Cu), tungsten carbide (WC), titanium (Ti), titanium nitride (TiN), or aluminum copper (Al—Cu).

In some embodiments, the conductive structure 114 and the conductive structure 116 are disposed on two opposite sides of the conductive structure 112. The conductive structure 114 is spaced apart from the conductive structure 112. The conductive structure 116 is spaced apart from the conductive structure 112. The conductive structure 112 is disposed between the conductive structure 114 and the conductive structure 116. The conductive structures 112, 114 and 116 are disposed side-by-side on the semiconductor layer 32. For example, the conductive structures 112, 114 and 116 are arranged in a direction substantially parallel to a top surface of the semiconductor layer 32.

In some embodiments, the conductive structure 115 (or the conductive structure 114) may function as a source (or a source terminal) of the transistor 110. In some embodiments, the conductive structure 117 (or the conductive structure 116) may function as a drain (or a drain terminal) of the transistor 110. For example, the conductive structures 113, 115 and 117 respectively function as the gate, the source and the drain of the transistor 110. Alternatively, the conductive structure 115 may serve as a drain of the transistor 110, and the conductive structure 117 may serve as a source of the transistor 110 depending on different design specifications.

The transistor M5 is disposed on the semiconductor layer 32. In some embodiments, the transistor M5 includes a similar or same structure as the structure of the transistor 110. For example, the transistor M5 includes a conductive structure M51, which may function as a gate of the transistor M5. The transistor M5 includes a conductive structure M52, which may function as a source of the transistor M5. The transistor M5 includes a conductive structure M53, which may function as a drain of the transistor M5.

The diode D1 is disposed on the semiconductor layer 32. In some embodiments, the diode D1 may include conductive structures D11, D13, D14, D15 and an insulation layer D12.

The insulation layer D12 is disposed on the semiconductor layer 32. The insulation layer D12 may include a dielectric material. The insulation layer D12 may include nitride. The insulation layer D12 may include, for example, but not limited to, silicon nitride ($Si_3N_4$). The insulation layer D12 may include oxide. The insulation layer D12 may include, for example, but not limited to, silicon oxide ($SiO_2$). In some embodiments, the insulation layer D12 may increase the resistance of the diode D1, which can reduce the leakage current of the diode D1. In some embodiments, as shown in FIG. 3, the insulation layer D12 may extend within a portion of the semiconductor layer 32. For example, the semiconductor layer 32 may cover a least a portion of a lateral surface (or sidewall) of the insulation layer D12. In other embodiments, the insulation layer D12 may not extend within the semiconductor layer 32. For example, a bottom surface of the insulation layer D12 is in contact with a top surface of the semiconductor layer 32.

The conductive structure D11 is disposed on the semiconductor layer 32. The conductive structure D11 is disposed on the insulation layer D12. For example, a portion of the conductive structure D11 is in contact with the semiconductor layer 32, and another portion of the conductive structure D11 is in contact with the insulation layer D12. The conductive structure D11 may include a metal. In some embodiments, the conductive structure D11 may include, for example, but not limited to, titanium (Ti) and nickel (Ni). In some embodiments, the conductive structure D11 may include a metal alloy. The conductive structure D11 may include, for example, but not limited to, titanium nitride (TiN).

The conductive structure D13 is disposed on the conductive structure D11. The conductive structure D13 may serve as a through via. The conductive structure D13 may serve as a through via electrically connecting the conductive structure D11 to the outside. The conductive structure D13 may include metal. The conductive structure D13 may include a metal compound. The conductive structure D13 may include, for example, but not limited to, copper (Cu), tungsten carbide (WC), titanium (Ti), titanium nitride (TiN), or aluminum copper (Al—Cu).

The conductive structure D14 is disposed on the semiconductor layer 32. The conductive structure D14 may include a metal. In some embodiments, the conductive structure D14 may include, for example, but not limited to, aluminum (Al), titanium (Ti), palladium (Pd), nickel (Ni), and tungsten (W). In some embodiments, the conductive structure D14 may include a metal alloy. The conductive structure D14 may include, for example, but not limited to, titanium nitride (TiN). In some embodiments, the conductive structure D14 may be or include a multi-layer structure. For example, the conductive structure D14 may include Ti, AlSi, Ti and TiN. In some embodiments, as shown in FIG. 3, the conductive structure D14 may extend within a portion of the semiconductor layer 32. For example, the semiconductor layer 32 may cover a least a portion of a lateral surface (or sidewall) of the conductive structure D14. In other embodiments, the conductive structure D14 may not extend within the semiconductor layer 32. For example, a bottom surface of the conductive structure D14 is in contact with a top surface of the semiconductor layer 32.

The conductive structure D15 is disposed on the conductive structure D14. The conductive structure D15 may serve as a through via. The conductive structure D15 may serve as a through via electrically connecting the conductive structure D14 to the outside. The conductive structure D15 may include metal. The conductive structure D15 may include a metal compound. The conductive structure D15 may include, for example, but not limited to, copper (Cu), tungsten carbide (WC), titanium (Ti), titanium nitride (TiN), or aluminum copper (Al—Cu).

In some embodiments, the conductive structure D13 (or the conductive structure D11) may serve as an anode of the diode D1. In some embodiments, the conductive structure D15 (or the conductive structure D14) may serve as a cathode of the diode D1. Alternatively, the conductive structure D13 may serve as a cathode of the diode D1, and the conductive structure D15 may serve as an anode of the diode D1 depending on different design specifications.

The diodes D1, D2, D3, D4, D5 and D6 are disposed on the semiconductor layer 32. The diodes D1, D2, D3, D4, D5 and D6 are physically spaced apart from each other. The diodes D1, D2, D3, D4, D5 and D6 are disposed side-by-side on the semiconductor layer 32. For example, the diodes D1, D2, D3, D4, D5 and D6 are arranged in a direction substantially parallel to a top surface of the semiconductor layer 32.

In some embodiments, each of the diodes D2, D3, D4, D5 and D6 includes a similar or same structure as the structure of the diode D1. For example, the diode D2 includes a conductive structure D21, which may function as an anode of the diode D2. The diode D2 includes a conductive structure D22, which may function as a cathode of the diode D2. For example, the diode D3 includes a conductive structure D31, which may function as an anode of the diode D3. The diode D3 includes a conductive structure D32, which may function as a cathode of the diode D3. For example, the diode D4 includes a conductive structure D41, which may function as an anode of the diode D4. The diode D4 includes a conductive structure D42, which may function as a cathode of the diode D4. For example, the diode D5 includes a conductive structure D51, which may function as an anode of the diode D5. The diode D5 includes a conductive structure D52, which may function as a cathode of the diode D5. For example, the diode D6 includes a conductive structure D61, which may function as an anode of the diode D6. The diode D6 includes a conductive structure D62, which may function as a cathode of the diode D6.

As shown in FIG. 3, the conductive structure D61 of the diode D6 is connected to the conductive structure D52 of the diode D5. The conductive structure D51 of the diode D5 is connected to the conductive structure D42 of the diode D4. The conductive structure D41 of the diode D4 is connected to the conductive structure D32 of the diode D3. The conductive structure D31 of the diode D3 is connected to the conductive structure D22 of the diode D2. The conductive structure D21 of the diode D2 is connected to the conductive structure D15 of the diode D1. The conductive structure D13 of the diode D1 is connected to the conductive structure M53 of the transistor M5 and the conductive structure 113 of the transistor 110. The conductive structure D62 is connected to the resistor R2 and the conductive structure M51 of the transistor M5. The conductive structure M52 of the transistor M5 and the conductive structure 115 of the transistor 110 are connected to ground.

The passivation layer 33 is disposed on the semiconductor layer 32. The passivation layer 33 covers the transistors 110, M5 and the diodes D1, D2, D3, D4, D5, D6. The passivation layer 33 exposes a portion (e.g., a top portion) of each of the conductive structures 113, 115, 117, M51, M52, M53, D13, D15, D21, D22, D31, D32, D41, D42, D51, D52, D61, D62 for electrical connections. The passivation layer 33 may serve as an interlayer dielectric layer. The passivation layer 33 may include a dielectric material. The passivation layer 33 may include a nitride. The passivation layer 33 may include, for example, but not limited to, silicon nitride ($Si_3N_4$). The passivation layer 33 may include an oxide. The passivation layer 33 may include, for example, but not limited to, silicon oxide ($SiO_2$). The passivation layer 33 can electrically isolate the conductive structures 113, 115, 117, M51, M52, M53, D13, D15, D21, D22, D31, D32, D41, D42, D51, D52, D61, D62 from each other.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a first III-V compound semiconductor layer;
a second III-V compound semiconductor layer disposed on the first III-V compound semiconductor layer, wherein the second III-V compound semiconductor layer has a relatively greater band gap than that of the first III-V compound semiconductor layer, so as to generate a two-dimensional electron gas (2DEG) region at a heterostructure between the first III-V compound semiconductor layer and the second III-V compound semiconductor layer;
a first group III nitride transistor disposed on the second III-V compound semiconductor layer; and
an electrostatic discharge (ESD) protection circuit comprising:
a diode disposed on the second III-V compound semiconductor layer and having an anode electrically connected to a gate of the first group III nitride transistor; and
a second transistor disposed on the second III-V compound semiconductor layer and having a drain electrically connected to the gate of the first group III nitride transistor, a gate electrically connected to a cathode of the diode and a source electrically connected to a source of the first group III nitride transistor, wherein the first group III nitride transistor, the diode, and the second transistor are arranged in a direction parallel to a top surface of the second III-V compound semiconductor layer and collectively share the 2DEG region, wherein the second transistor is located between the first group III nitride transistor and the diode along the direction.

2. The electronic device of claim 1, wherein the ESD protection circuit further comprises N diodes electrically connected in series and between the drain of the second transistor and the gate of the second transistor, where N is an integer equal to or greater than 2.

3. The electronic device of claim 2, wherein threshold voltages of the diodes of the ESD protection circuit have a variation less than 0.3V.

4. The electronic device of claim 2, wherein the ESD protection circuit is configured to drain a current from the gate of the first group III nitride transistor if a voltage applied to the gate of the first group III nitride transistor is equal to or greater than a sum of threshold voltages of the diodes and a threshold voltage of the second transistor.

5. The electronic device of claim 4, wherein the current drained by the ESD protection circuit has a first portion flowing through the diodes and a second portion flowing through the second transistor, and the first portion of the current is less than the second portion of the current.

6. The electronic device of claim 1, wherein
the diode is a group III nitride Schottky barrier diode,
the second transistor is a group III nitride transistor, and
the diode and the second transistor are integrated with the first group III nitride transistor.

7. The electronic device of claim 1, further comprising a resistor connected between the gate of the second transistor and the source of the second transistor.

8. The electronic device of claim 1, wherein the first group III nitride transistor is a power device.

9. An electronic device, comprising:
a first III-V compound semiconductor layer;
a second III-V compound semiconductor layer disposed on the first III-V compound semiconductor layer, wherein the second III-V compound semiconductor layer has a relatively greater band gap than that of the first III-V compound semiconductor layer, so as to generate a two-dimensional electron gas (2DEG) region at a heterostructure between the first III-V compound semiconductor layer and the second III-V compound semiconductor layer;
a first group III nitride transistor disposed on the second III-V compound semiconductor layer; and
an electrostatic discharge (ESD) protection circuit electrically connected between a gate of the first group III nitride transistor and a source of the first group III nitride transistor, the ESD protection circuit comprising N diodes disposed on the second III-V compound semiconductor layer and electrically connected in series, wherein N is an integer equal to or greater than 2, and wherein threshold voltages of the diodes have a variation less than 0.3V, wherein the first group III nitride transistor and the N diodes are arranged in a direction parallel to a top surface of the second III-V compound semiconductor layer and collectively share the 2DEG region.

10. The electronic device of claim 9, further comprising a second group III nitride transistor having a drain electrically connected to the gate of the first group III nitride transistor and a source electrically connected to the source of the first group III nitride transistor.

11. The electronic device of claim 10, wherein the diodes comprising
a first diode having an anode electrically connected to the drain of the second group III nitride transistor; and
a second diode having an anode electrically connected to a cathode of the first diode and a cathode electrically connected to the gate of the second group III nitride transistor.

12. The electronic device of claim 10, further comprising a resistor connected between a gate of the second group III nitride transistor and the source of the second group III nitride transistor.

13. The electronic device of claim 10, wherein the ESD protection circuit is configured to drain a current from the gate of the first group III nitride transistor if a voltage applied to the gate of the first group III nitride transistor is equal to or greater than a sum of threshold voltages of the diodes and a threshold voltage of the second group III nitride transistor.

14. The electronic device of claim 13, wherein the current drained by the ESD protection circuit has a first portion flowing through the diodes and a second portion flowing through the second group III nitride transistor, and the first portion of the current is less than the second portion of the current.

15. The electronic device of claim 9, wherein
the diodes are group III nitride Schottky barrier diodes, and
the diodes are integrated with the first group III nitride transistor.

16. The electronic device of claim 9, wherein the first group III nitride transistor is a power device.

17. The electronic device of claim 2, wherein the N diodes are disposed on the second III-V compound semiconductor layer and are arranged in the direction, wherein all of the N diodes are located at the same side of the first group III nitride transistor and the second transistor.

18. The electronic device of claim 2, wherein the N diodes are disposed on the second III-V compound semiconductor layer and are arranged in the direction, wherein all of the N diodes are located at a single side of the first group III nitride transistor.

* * * * *